(12) United States Patent
Dörfler et al.

(10) Patent No.: US 6,605,778 B2
(45) Date of Patent: Aug. 12, 2003

(54) CIRCUIT CARRIER, IN PARTICULAR PRINTED CIRCUIT BOARD

(75) Inventors: Helmut Dörfler, Erlangen (DE); Heiko Mueller, Erlangen (DE); Sebastian Raith, Erlangen (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/969,719

(22) Filed: Oct. 2, 2001

(65) Prior Publication Data

US 2002/0047193 A1 Apr. 25, 2002

(30) Foreign Application Priority Data

Oct. 2, 2000 (DE) .......................... 100 49 084
Jun. 5, 2001 (DE) .......................... 101 27 268

(51) Int. Cl.[7] ................................................. H05K 5/00
(52) U.S. Cl. ...................... 174/52.1; 361/688; 361/704; 361/748; 257/698
(58) Field of Search .................... 174/52.1, 16.3, 174/17 VA, 52.2; 361/688, 704, 712, 748; 257/698, 706, 712, 787

(56) References Cited

U.S. PATENT DOCUMENTS 4,023,197 A * 5/1977 Magdo et al. ............... 257/684
5,208,729 A * 5/1993 Cipolla et al. .............. 361/690
5,317,404 A * 5/1994 Fukushima et al. ........... 348/64
6,236,098 B1 * 5/2001 Efland et al. ................ 257/467

* cited by examiner

Primary Examiner—Dean A. Reichard
Assistant Examiner—W. David Walkenhorst
(74) Attorney, Agent, or Firm—Baker Botts LLP

(57) ABSTRACT

A circuit carrier (2) (printed circuit board 2) has two metallic outer layers (13, 14) and at least one metallic intermediate layer (11, 12). Insulating layers (8, 9) are arranged between the outer layers (13, 14) and the intermediate layer (11, 12). A component (3, 5) to be cooled and a cooling element (6, 7) are arranged on the outer layers (13, 14). The cooling element (6, 7) is thermally coupled to the component (3, 5) to be cooled via a heat conducting path. The heat conducting path runs partly in the intermediate layer (11, 12). Heat is transferred transversely in said path.

15 Claims, 2 Drawing Sheets

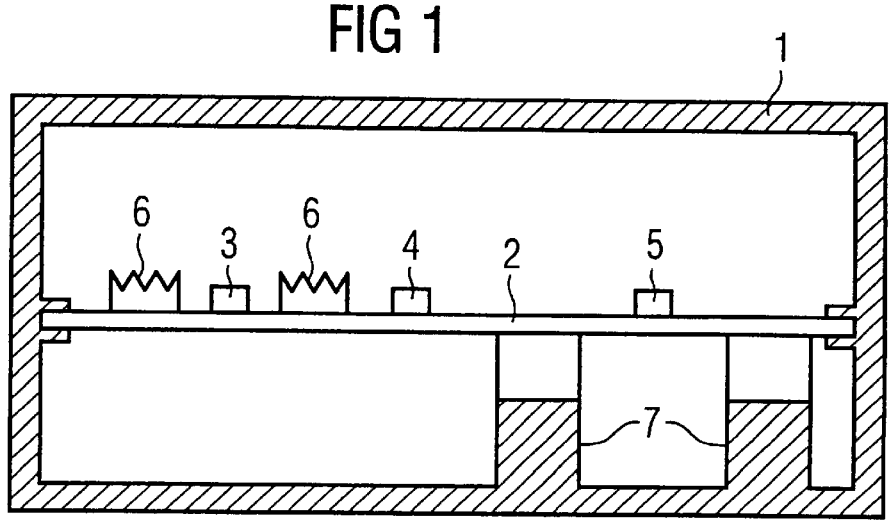
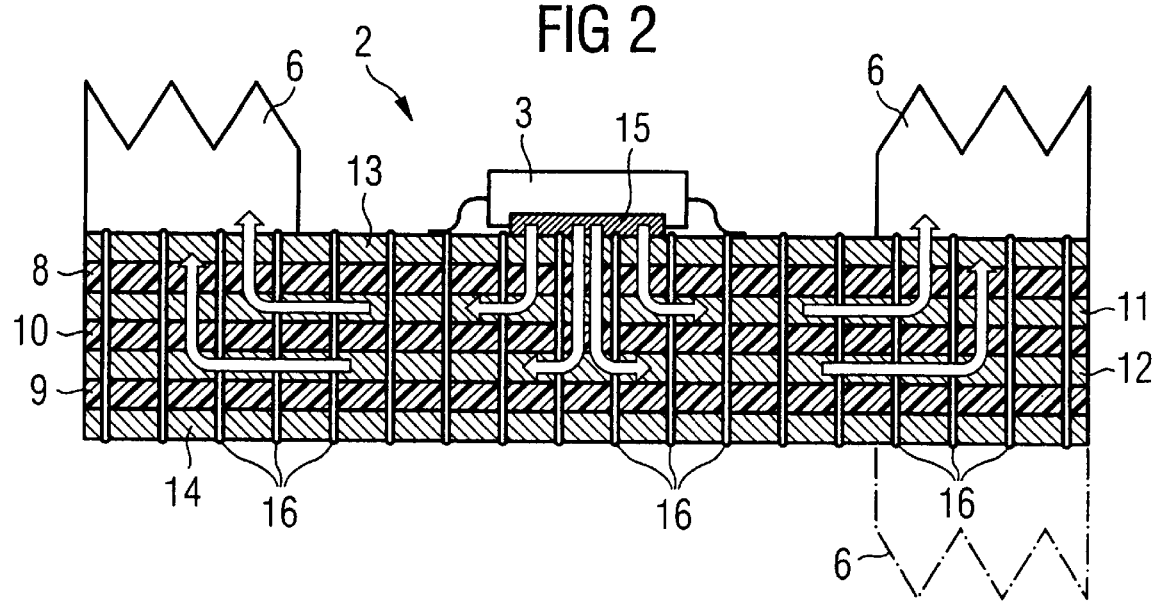

CIRCUIT CARRIER, IN PARTICULAR PRINTED CIRCUIT BOARD

FIELD OF THE INVENTION

The present invention relates to a circuit carrier, in particular a printed circuit board, having two metallic outer layers and at least one metallic intermediate layer. Insulating layers are arranged between the outer layers and the intermediate layer. At least one component to be cooled is arranged on at least one of the outer layers, and at least one cooling element is arranged on at least one of the outer layers. The cooling element is thermally coupled to the component to be cooled via at least one heat conducting path.

Circuit carriers of this type are generally known.

BACKGROUND OF THE INVENTION

When heat arises in the electrical and electronic components arranged on such circuit carriers, such as printed circuit boards, it has to be dissipated. Since a component's own surface does not suffice for this purpose, it is known in the prior art to arrange a heat sink on the component, or to thermally couple the component directly to a housing surrounding the circuit carrier. Furthermore, it is known to dissipate the heat that occurs via the circuit carrier. A number of possibilities are known in the prior art for this purpose.

For example, it is known to distribute the heat within the contact area on which the component is arranged (so-called thermal spreading). However, this measure has only a limited effect since the thermal resistance in the very thin contact area (approximately 25 to 200 $\mu$m) is relatively large.

It is also known to dissipate the heat through the circuit carrier to a heat sink or the housing, which is arranged opposite the component on the other outer layer. The thermal coupling is in this case effected by means of metallic plated-through holes (thermal vias). This embodiment is restricted to configurations in which the component to be cooled is at the same electrical potential as the cooling element.

SUMMARY OF THE INVENTION

The object of the present invention is to develop a circuit carrier of the type mentioned in the introduction in such a way that the arrangement and linking of the cooling elements to a component to be cooled can be configured more flexibly. The object is achieved by causing the heat conducting path to run partly in the intermediate layer so that heat is transferred transversely in the intermediate layer. It is thereby possible for the heat to be dissipated not only in the outer layer on which the component is arranged but also laterally via the intermediate layer. This significantly reduces the thermal resistance during the transverse dissipation of heat.

If the intermediate layer is electrically connected to the component and/or the cooling element, the result is particularly effective if the intermediate layer is coupled to the component or the cooling element. In so far as is necessary for potential isolation, however, the intermediate layer can be electrically isolated from the cooling element or the component. If the electrical connection is at least one metallic plated-through hole (thermal via), the electrical connection can be created in a particularly simple manner during the production of the circuit carrier.

The component and the cooling element can be arranged on the same outer layer or on different outer layers. If the elements are arranged on the same outer layer, electrical isolation of component and cooling element can be realized in a particularly simple manner by arranging them on a respective contact areas, which are electrically isolated from one another by an isolation trench.

If the isolation trench is dimensioned in such a way that it has precisely the dimensions of the minimum permissible air and creepage clearance of the corresponding voltage class, comparatively good thermal coupling of the contact areas to one another is nevertheless produced. In this case, the coupling can be optimized by filling the isolation trench with an insulating medium, e.g. a soldering resist. This is because the insulating medium usually conducts heat considerably better than air, although nowhere near as well as metal.

If the elements are arranged on different outer layers, they can be arranged, offset relative to one another (which is necessarily the case when they are arranged on the same outer layer).

The component is thermally coupled to the outer layer particularly well if it is designed as a surface-mounted component. The coupling is even better if a contact body is arranged between the component and the outer layer.

The transverse transfer of heat can be increased by the circuit carrier having more than one metallic intermediate layer, within an insulating inner layer being arranged between two respective metallic intermediate layers and heat being transferred transversely in at least two of the intermediate layers. If the cooling element is a constituent part of a housing for the circuit carrier, the component can be cooled particularly effectively.

BRIEF DESCRIPTION OF THE DRAWINGS

Further advantages and details are apparent from the following description of an exemplary embodiment of the present invention in context with the drawings, in which:

FIG. 1 shows an electrical assembly;

FIG. 2 shows a detail from FIG. 1;

DETAILED DESCRIPTION OF THE INVENTION

Figure 3:
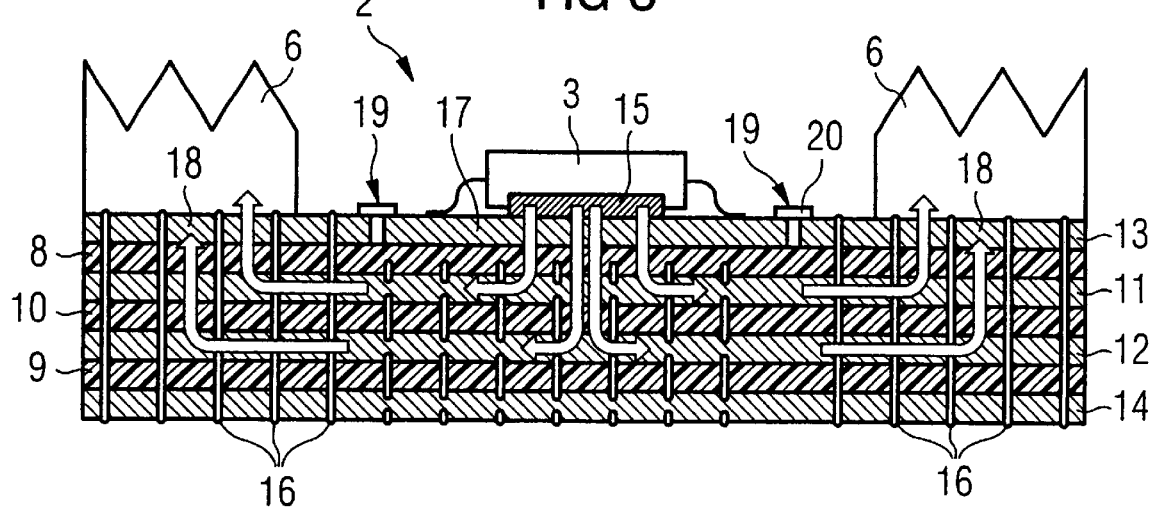
FIG. 3 shows a modification of FIG. 2.

In accordance with FIG. 1, an electrical assembly has a housing 1, and a circuit carrier 2, which as shown is designed as a printed circuit board and held in the housing 1. Components 3 to 5 are arranged on the printed circuit board 2. Of these components 3 to 5, the component 4, for example, can be operated without additional cooling. By contrast, the components 3 and 5 are assigned cooling elements 6, 7. In accordance with FIG. 1, the component 3 is assigned dedicated cooling elements 5, 6, for example, whereas the cooling element 7 for the component 5 is a constituent part of the housing 1.

In accordance with FIG. 2, the circuit carrier 2 has two insulating layers 8, 9, between which an insulating inner layer 10 is arranged. A respective intermediate layer 11, 12 is arranged between the inner layer 10 and the insulating layers 8, 9. Outer layers 13, 14 are arranged on the outside of the insulating layers 8, 9.

The outer layers 13, 14 and the intermediate layers 11, 12 are originally uniform metallic (generally copper) layers.

They are partly removed, so that the remaining part of the layers 11 to 14 forms conductor tracks. The latter essentially serve for the electrical connection of the components 3 to 5.

In accordance with FIG. 2, the component 3 is designed as a surface-mounted component. In this case, a contact body 15 is arranged between the component 3 and the outer layer 13, and ensures better thermal linking of the component 3 to the outer layer 13.

In accordance with FIG. 2, the cooling element 5, 6 and the component 3 are arranged on the same outer layer 13. Furthermore, the outer layer 13 is continuous in the region between the component 3 and the cooling element 5, 6. The component 3 and the cooling element 5, 6 are therefore electrically connected to one another.

In accordance with FIG. 2, in the region of the cooling element 5, 6 and in the region of the component 3, metallic plated-through holes 16 (so-called thermal vias 16) are introduced into the printed circuit board 2. By means of these plated-through through holes 16, the component 3 and the cooling element 5, 6 are directly electrically connected to the intermediate layers 11, 12 and also the other outer layer 14. The component 3 is thus thermally coupled to the cooling elements 6 via a multiplicity of heat conducting paths. As shown, a first heat conducting path runs directly in the outer layer 13, on which the component 3 and the cooling elements 6 are arranged. Further heat conducting paths run via the plated-through holes 16 and the intermediate layers 11, 12 or the other outer layer 14. In this case, heat is transferred transversely in the intermediate layers 11, 12 and the other outer layer 14.

On account of the continuous nature of the plated-through holes 16 from the outer layer 13 to the outer layer 14, it would also be possible, as an alternative or additionally, to arrange the cooling elements 6 on the outer layer 14 opposite to the component 3. This is indicated by broken lines for a further cooling element 6 in FIG. 2.

FIG. 3 essentially corresponds to FIG. 2. Only the differences from FIG. 2 are discussed below. Moreover, reference symbols are depicted in FIG. 3 only to the extent necessary for understanding the differences from FIG. 2.

In FIG. 3, the component 3 and the cooling elements 6 are arranged on a respective contact area 17, 18 of the outer layer. The contact areas 17, 18 are electrically isolated from one another by an isolation trench 19. Moreover, only the plated-through holes 16 in the region of the cooling elements 6 are continuous. Thus, the cooling elements 6 are still electrically connected to the intermediate layers 11, 12 and the other outer layer 14. In the region of the component 3, by contrast, the plated-through holes 16 are either not present at all or else they end in the intermediate layer 11 which adjoins the insulating layer 8. The component 3 is thus electrically isolated from the intermediate layers 11, 12 and the other outer layer 14. Nevertheless, there is good thermal coupling between the component 3 and the cooling elements 6, because the heat to be dissipated only has to penetrate a single (relatively thin) insulating layer, namely the insulating layer 8. Further, the transverse transfer of heat, which takes place in the intermediate layers 11, 12 and the other outer layer 14, can take place in layers of good thermal conductivity, namely the layers 11, 12 and 14. The heat can then be transferred more easily to the cooling elements 6 via the plated-through holes 16 in the region of the cooling elements 6.

Depending on the circumstances of the individual case, it is also possible, as an alternative, for the component 3 to be electrically connected to the intermediate layers 11, 12 and the other outer layer 14, and for the cooling elements 6 to be kept electrically isolated from the layers 11, 12, 14.

The component 3 is operated in a previously known voltage range (voltage class). For the previously known voltage range, it is known what minimum distances have to be complied with for air and creepage clearances. In order to optimize the thermal coupling of the contact areas 17, 18 to one another, the isolation trench 19 is therefore dimensioned to be as small as possible so as to just meet the dimensions of the minimum permissible air and creepage clearance of the corresponding voltage class of the component 3.

In order to improve the thermal coupling even further, the isolation trench 19 is filled with an insulating medium 20. The insulating medium 20 is typically a soldering resist. The improvement in the thermal coupling is achieved here by virtue of the fact that the insulating medium conducts heat considerably better than air, although usually considerably worse than metal. Furthermore, the insulating medium 20 protects the isolation trench 19 against contamination and short circuits of the contact areas 17, 18 that can be caused thereby.

Figure 4:
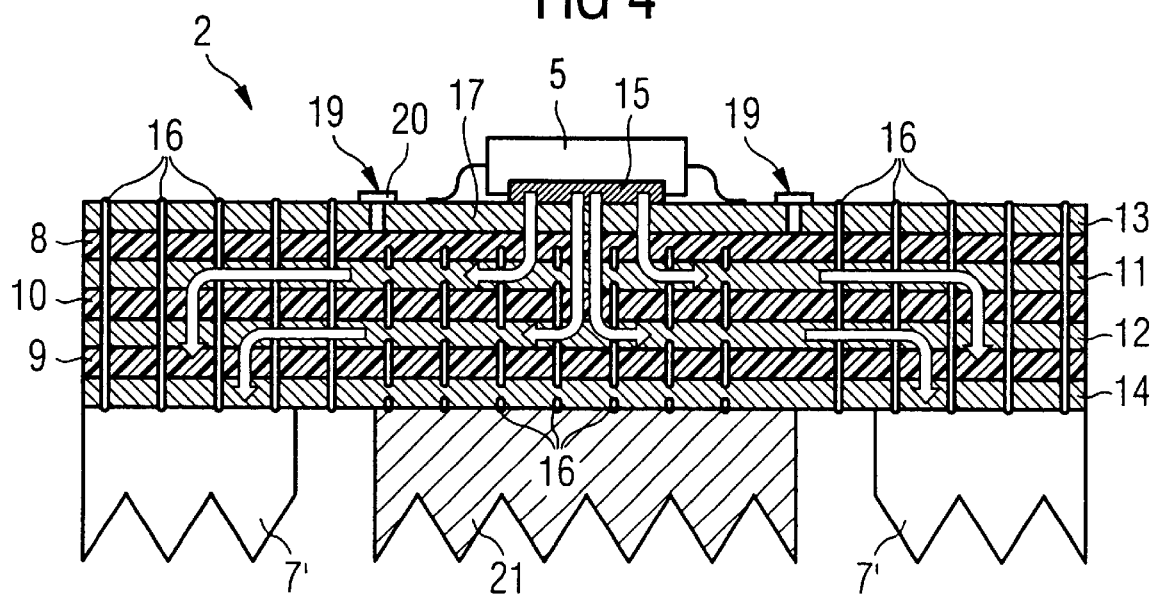
FIG. 4 shows a further detail from FIG. 1.

In FIG. 4, the component 5 and the cooling elements 7 are electrically isolated from one another. In this case, the electrical isolation can be effected on the one hand by omission of the plated-through holes 16 in the region of the component 5, and associated electrical isolation of the component 5 from the intermediate layers 11, 12. As an alternative, the electrical isolation of the cooling elements 7 from the intermediate layers 11, 12 is also possible in this case.

In contrast to FIG. 3, however, in FIG. 4 the component 5 and the cooling elements 7 are arranged on different outer layers 13, 14. Moreover, the component 5 and the cooling elements 7 are arranged offset relative to one another on the circuit carrier 2. However, in FIG. 4, heat is also again transferred transversely in the intermediate layers 11, 12 and the other outer layer 14. Moreover, plated-through holes 16 in the outer layer 14 and the intermediate layers 11, 12 can be effected in the region of the component 5. Only the outer layer 13, on which the component 5 is arranged, must not be concomitantly through-plated.

In FIGS. 1 and 4, the heat arising in the component 5 is not conducted directly to the cooling elements 7, but first to intermediate bodies 7' connected to the housing 1 or the cooling elements 7 therein.

In a supplementary manner, FIG. 4 also depicts a further cooling element 21 in a hatched manner. This cooling element 21 is arranged such that it is not offset relative to the component 5. However, this cooling element 21 is also directly electrically isolated from the component 5, although thermally coupled to it.

Finally, it shall also be mentioned that the—preferably symmetrical—arrangement of the cooling elements 6, 7 on both sides of the components 3, 5 as illustrated in FIGS. 1 to 4 is, of course, advantageous. However, the presence of just a single cooling element 6 and 7 is also possible and lies within the scope of the present invention.

We claim:

1. A circuit carrier comprising a plurality of metallic outer layers and at least one metallic intermediate layer further comprising a plurality of insulating layers being arranged between the outer layers and the intermediate layer; at least one component to be cooled being arranged on at least one of the outer layers, and at least one cooling element being arranged on at least one of the outer layers which said cooling element is thermally coupled to the component to be cooled via at least one heat conducting path, wherein the heat conducting path runs partly in the intermediate layer with heat being transferred transversely in the intermediate layer.

2. The circuit carrier according to claim 1, wherein the component and the cooling element are directly electrically connected to the intermediate layer.

3. The circuit carrier according to claim 1, wherein the component is directly electrically connected to the intermediate layer and the cooling element is directly electrically isolated from the intermediate layer.

4. The circuit carrier according to claim 1, wherein the component is directly electrically isolated from the intermediate layer and the cooling element is directly electrically connected to the intermediate layer.

5. The circuit carrier according to claims 2, 3 or 4, wherein the direct electrical connection is via at least one metallic plated-through hole.

6. The circuit carrier according to claim 1, wherein the component and the cooling element are arranged on the same outer layer.

7. The circuit carrier according to claim 6, wherein the component and the cooling element are arranged respectively on contact areas which are directly electrically isolated from one another by an isolation trench.

8. The circuit carrier according to claim 7, wherein the isolation trench has substantially precisely the dimensions of the minimum permissible air and creepage clearance of a corresponding voltage class.

9. The circuit carrier according to claim 7, wherein the isolation trench is filled with an insulating medium.

10. The circuit carrier according to claim 1, wherein a component and a cooling element are arranged on different outer layers.

11. The circuit carrier according to claim 10, wherein the component and the cooling element are arranged offset relative to one another on the circuit carrier.

12. The circuit carrier according to claim 1, wherein the component is designed as a surface-mounted component.

13. The circuit carrier according to claim 1, wherein a contact body is arranged between the component and the outer layer.

14. The circuit carrier according to claim 1, further comprising a plurality of metallic intermediate layers and an insulating inner layer arranged between each of the metallic intermediate layers so that heat is transferred transversely in at least two of the intermediate layers.

15. The circuit carrier according to claim 1, wherein the cooling element is a constituent part of a housing for the circuit carrier.

* * * * *